United States Patent [19]
Shibano et al.

[11] Patent Number: 5,264,703
[45] Date of Patent: Nov. 23, 1993

[54] ELECTRON BEAM INSTRUMENT

[75] Inventors: Akira Shibano, Tokyo; Kiyoshi Harasawa, Itsukaichi, both of Japan

[73] Assignee: Jeol Ltd., Tokyo, Japan

[21] Appl. No.: 944,449

[22] Filed: Sep. 14, 1992

[30] Foreign Application Priority Data

Sep. 20, 1991 [JP] Japan .................................. 3-240980

[51] Int. Cl.⁵ .............................................. H01J 37/21
[52] U.S. Cl. .................................. 250/396 R; 250/310
[58] Field of Search ............ 250/396 R, 306 ML, 310, 250/311

[56] References Cited

U.S. PATENT DOCUMENTS

| | | | |
|---|---|---|---|
| 4,393,309 | 7/1983 | Norioka | 250/396 R |
| 5,130,540 | 7/1992 | Yamada | 250/396 R |
| 5,187,371 | 2/1993 | Matsui et al. | 250/396 R |
| 5,225,676 | 7/1993 | Matsuya | 250/396 R |

*Primary Examiner*—Paul M. Dzierzynski
*Assistant Examiner*—Kiet T. Nguyen
*Attorney, Agent, or Firm*—Webb, Burden, Ziesenheim & Webb

[57] ABSTRACT

An electron beam instrument typified by a scanning electron microscope. The instrument does not suffer from defocus if the accelerating voltage is varied. The instrument has an objective lens, an electron gun emitting an electron beam, a control unit, an accelerating voltage-setting portion, first and second reference voltage sources. The control unit digitizes the accelerating voltage set by the accelerating voltage-setting portion and applies the digital voltage to the two reference voltage sources. The first voltage source consists of a first ROM and a first D/A converter. Similarly, the second voltage source consists of a second ROM and a second D/A converter. A signal $V_{ref1}$ indicating the optimum objective lens current at a first working distance is stored in the first ROM. A signal $\Delta V$ indicating the difference between the optimum objective lens current at a second working distance and the optimum objective lens current at the first working distance is stored in the second ROM. The output voltage from the second voltage source is applied to one end of a variable resistor acting as a focus-adjusting means. The first reference voltage is applied to one input terminal of an adder. The output voltage from the variable resistor is applied to the other input terminal of the adder. The output voltage from the adder can be varied from $V_{ref1}(V_{H1})$ to $V_{ref1}(V_{H1})+\Delta V(V_{H1})$ by adjusting the movable contact of the variable resistor. Hence, the focus can be adjusted.

6 Claims, 4 Drawing Sheets

ELECTRON BEAM INSTRUMENT

FIELD OF THE INVENTION present invention relates to an electron beam instrument such as a scanning electron microscope (SEM), X-ray microanalyzer or electron-beam length-measuring machine.

BACKGROUND OF THE INVENTION

In a scanning electron microscope or the like, the working distance of the objective lens is generally adjustable. When the working distance is varied, it is necessary to modify the objective lens current. This technique is disclosed in U.S. Pat. No. 4,393,309. In addition, it is customary that the accelerating voltage for the electron beam is variable. Where the accelerating voltage is varied while maintaining the working distance constant, the objective lens current is changed according to the varying accelerating voltage to prevent defocus. A configuration for this scheme is schematically shown in FIG. 7.

In FIG. 7, an accelerating voltage-setting portion 2 consists of a ten-key pad, knob or the like. If a control unit 1 as consisting of a microprocessor senses that the accelerating voltage-setting portion 2 is operated to indicate a new accelerating voltage $V_H$ under predetermined conditions, then the control unit 1 produces a digital value $V_H^{*\frac{1}{2}}$ that is the square root of the accelerating voltage $V_H$ to which a relativistic correction is made. The digital value produced from the control unit 1 is converted into analog form by a D/A converter 3. A desired fraction of the analog voltage from the converter 3 is obtained from a variable resistor 4 acting as a focus-adjusting means and supplied to an objective lens current source 5. This current source 5 produces an exciting current proportional to the above-described value $V_H^{*\frac{1}{2}}0$ to an objective lens coil 6. A focus-adjusting mechanism 7 consists of a knob. The resistance value of the variable resistor 4 can be controlled by rotating this knob.

The conventional structure shown in FIG. 7 can cope with none of the case (1) in which the magnetic poles forming the objective lens saturate, the case (2) in which the magnetic poles do not fully saturate but the nonlinearity of the B-H characteristic curve of the magnetic pole pieces affects the focusing, and the case (3) in which the residual magnetization due to the hysteresis affects the focusing. In these cases, if the accelerating voltage is varied, defocus occurs.

More specifically, in the structure shown in FIG. 7, when no potential gradient exists, the paraxial orbital equation is given by $$X'' + (eB^2/8mV_H^*)X = 0$$

where X is the orbit of electrons expressed in terms of a system of rotational coordinates, e/m is the specific charge to mass ratio of an electron, $V_H^*$ is the accelerating voltage to which a relativistic correction is made, and B is the axial magnetic field. This structure is built on the principle that the axial magnetic field is in proportion to the exciting current fed to the objective lens provided that (1) $B^2/V_H^*$ is a parameter, and (2) the magnetic poles do not saturate and no permanent magnet is used in the objective lens. Therefore, this structure is quite advantageous where these two requirements are satisfied. However, these conditions are not met in the case in which the magnetic poles saturate, in the case in which the magnetic poles do not fully saturate but the nonlinearity of the B-H characteristic curve of the magnetic poles affects the focusing, or in the case in which the residual magnetization attributable to the hysteresis or other phenomenon affects the focusing. In any of these cases, defocus takes place. When the lens having the magnetic pole pieces saturates, the peak magnetic field generally weakens. Accordingly, in order to maintain the focal point fixed, an objective lens current is needed which is larger than the current proportional to the square root $V_H^{*\frac{1}{2}}$ of the accelerating voltage Vto which a relativistic correction is made. Since the magnetic field strength of the objective lens increases with increasing the objective lens current, where the working distance WD is varied while maintaining the accelerating voltage constant, if the working distance is shortened, the effect of the saturation of the magnetic pole pieces becomes more conspicuous than in the case in which the working distance is increased. Where the accelerating voltage is varied while maintaining the working distance constant, the effect is greater when the accelerating voltage is increased than when it is reduced. The objective lens current which is needed to maintain the focal point fixed is indicated by curves 30, 31, 33 in FIG. 2.

On the other hand, where the accelerating voltage is changed while the working distance WD is kept constant, $V_H^{*\frac{1}{2}}$ is not input to the D/A converter 3 but the working distance WD is read from the focus-adjusting mechanism 7 as shown in FIG. 8. Then, $V_H^{*\frac{1}{2}}$ is modified, taking account of the saturation of the magnetic pole pieces at this working distance WD read out in this way and applied to the D/A converter 3. In FIG. 8, this modified value is denoted by $$\overline{\sqrt{V_H^*}}$$

In this way, defocus can be prevented when the accelerating voltage is varied. In this case, however, the control unit 1 must be loaded with a table of every value of the working distance WD corresponding to every value of the accelerating voltage. In consequence, the capacity of the memory is exorbitant.

SUMMARY OF THE INVENTION

It is an object of the present invention to provide an electron beam instrument which is simple in structure and prevents defocus when the accelerating voltage is varied whatever value the working distance WD assumes where the nonlinearity of the B-H characteristic curve of the magnetic pole pieces of the objective lens affects the focusing or where the residual magnetization due to the hysteresis affects the focusing.

A first embodiment of the invention is an electron beam instrument comprising: an electron gun emitting an electron beam toward a specimen; an objective lens; an accelerating voltage-setting means for setting the accelerating voltage $V_H$ at which the electron beam is accelerated; a working distance-setting means for setting the working distance of the objective lens; storage means for storing $V_{ref1}$ and $\Delta V$ as functions of the accelerating voltage $V_H$, where $V_{ref1}$ is a signal indicating the optimum objective lens current at a first working distance $w_1$ and $\Delta V$ is a signal indicating the difference between the optimum objective lens current at a second working distance w₂ and the optimum objective lens current at the first working distance; a reading means for reading the signals $V_{ref1}(V_H)$ and $\Delta V(V_H)$ corresponding to the set accelerating voltage $V_H$ from the storage means according to the output signal from the accelerating voltage-setting means; and an objective lens current-generating means for producing a signal corresponding to a working distance w₀ set by the working distance-setting means by interpolation from the signals $V_{ref1}(V_H)$ and $\Delta V(V_H)$ read by the reading means. The objective lens current is set according to the output signal from the objective lens current-generating means.

A second embodiment of the invention is an electron beam instrument comprising: an electron gun emitting an electron beam toward a specimen; an objective lens; an accelerating voltage-setting means for setting the accelerating voltage $V_H$ at which the electron beam is accelerated; a working distance-setting means for setting the working distance of the objective lens; storage means for storing $V_{ref1}$ and $V_{ref2}$ as functions of the accelerating voltage, where $V_{ref1}$ and $V_{ref2}$ are signals indicating the optimum objective lens current at a first and a second working distance, respectively; a reading means for reading the signals $V_{ref1}(V_H)$ and $V_{ref2}(V_H)$ corresponding to the set accelerating voltage from the storage means according to the output signal from the accelerating voltage-setting means; and an objective lens current-generating means for producing a signal corresponding to a working distance w₀ set by the working distance-setting means by interpolation from the signals $V_{ref1}(V_H)$ and $V_{ref2}(V_H)$ read by the reading means. The objective lens current is set according to the output signal from the objective lens current-generating means.

The first reference voltage source produces a first reference voltage corresponding to an objective lens current optimal for the accelerating voltage set according to the first working distance of the objective lens. The second reference voltage source produces the difference between a second reference voltage and the first reference voltage. The second reference voltage corresponds to an objective lens current optimal for the accelerating voltage set according to the second working distance which is shorter than the first working distance.

The output voltage from the second reference voltage source can be appropriately adjusted by a voltage-adjusting means acting as a focus-adjusting means. An adder means produces the sum of the output voltage from the voltage-adjusting means and the output voltage from the first reference voltage source. The objective lens current source produces an objective lens current according to the output voltage from the adder means, the produced current being supplied to the coil of the objective lens.

Other objects and features of the invention will become obvious upon an understanding of the illustrative embodiments about to be described or will be indicated in the appended claims, and various advantages not referred to herein will occur to one skilled in the art upon employment of the invention in practice.

DETAILED DESCRIPTION OF THE INVENTION

Figure 1:
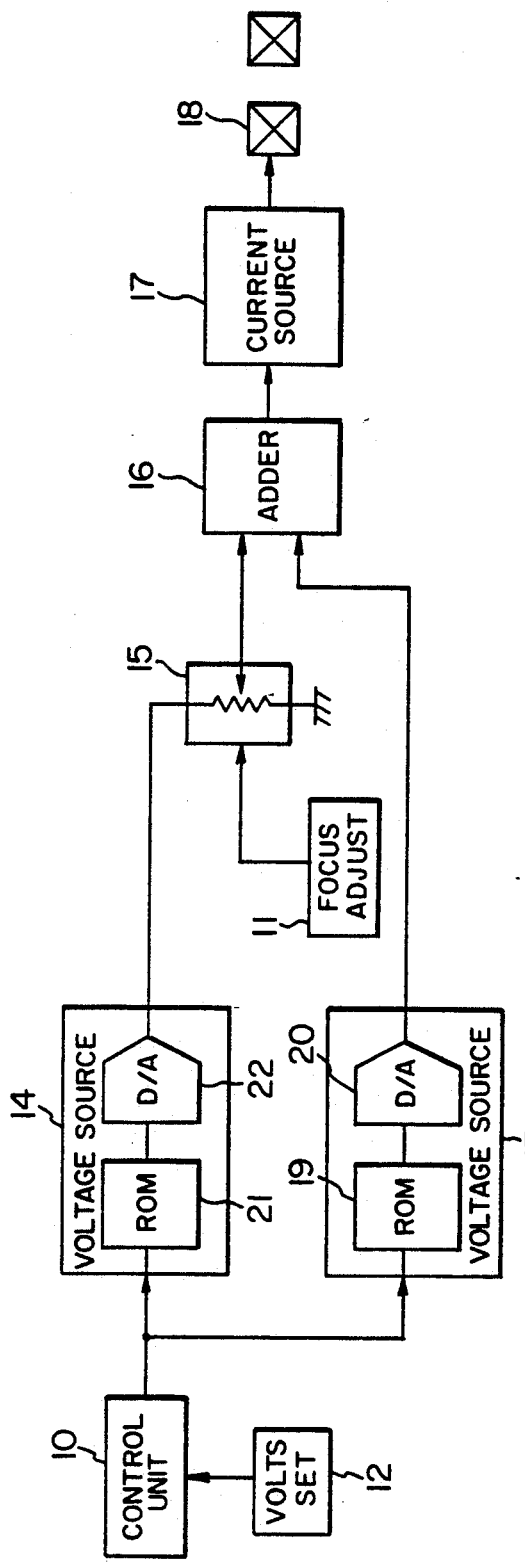
FIG. 1 is a block diagram of an electron beam instrument according to the invention.

Referring to FIG. 1, there is shown an electron beam instrument according to the invention. This instrument typified by a scanning electron microscope (SEM) comprises a control unit 10, a focus-adjusting mechanism 11, an accelerating voltage-setting portion 12 consisting of a ten-key pad or knob and connected with the control unit 10, a first reference voltage source 13 connected with the output of the control unit 10, a second reference voltage source 14 connected with the output of the control unit 10, a variable resistor 15, an adder circuit 16, an objective lens current source 17 connected with the output of the adder circuit 16, and an objective lens coil 18. The first reference voltage source 13 comprises a ROM 19 and a D/A converter 20. The second reference voltage source 14 comprises a ROM 21 and a D/A converter 22.

The control unit 10 consists of a microcomputer. When the accelerating voltage is set by means of the accelerating voltage-setting portion 12, the digital value of the set accelerating voltage is produced to the first reference voltage source 13 and to the second reference voltage source 14.

Figure 2:
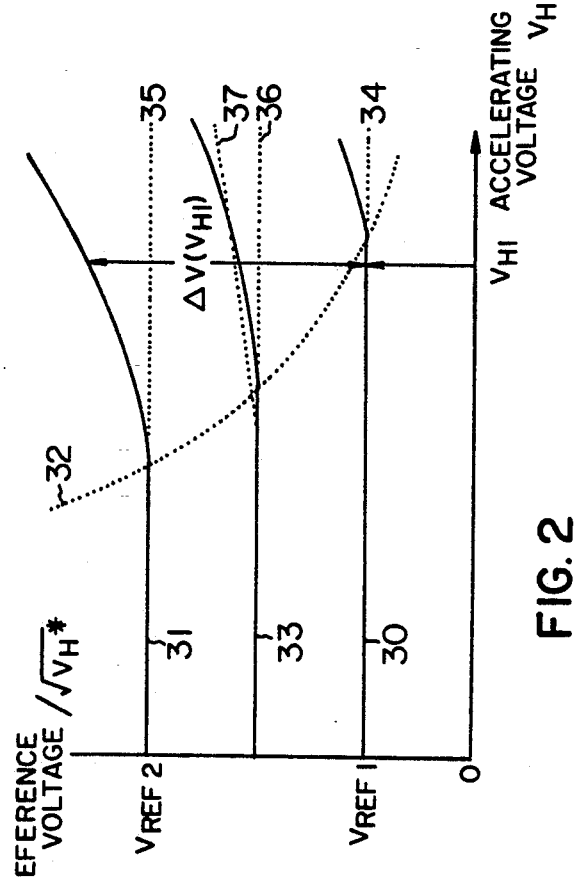
FIG. 2 is a graph illustrating data stored in ROMs incorporated in the instrument shown in FIG. 1.

The first reference voltage source 13 is composed of the ROM 19 and the D/A converter 20. Data about the curve 30 shown in FIG. 2 is stored in the ROM 19. A first reference voltage is produced from those memory locations of the first reference voltage source 13 which are addressed by the digital value of the accelerating voltage delivered from the control unit 10. This reference voltage is converted into analog form by the D/A converter 20 and applied to one input terminal of the adder circuit 16. This curve 30 gives the first reference voltage corresponding to the optimum objective lens current which does not result in defocus at the accelerating voltage determined by a given first working distance (e.g., the longest working distance of this SEM). This curve 30 can be prepared by presetting the working distance WD of this SEM to this first working distance, finding the objective lens current that does not produce defocus irrespective of changes in the accelerating voltage, and making a desired voltage correspond to this objective lens current. The vertical axis of the graph of FIG. 2 is the reference voltage divided by the square root of the accelerating voltage $V_H$ to which a relativistic correction is made. The value of the vertical axis is proportional to the objective lens current divided by the square root of the accelerating voltage $T_H$ to which a relativistic correction is made.

The second reference voltage source 14 comprises the ROM 21 and the D/A converter 22. Data about the difference between the curves 30 and 31 shown in FIG. 2 is stored in the ROM 21. A voltage corresponding to this difference is produced from those memory locations of the ROM 21 which are addressed by the digital value of the accelerating voltage produced from the control unit 10. The output voltage from the ROM 21 is converted into analog form by the D/A converter 22 and applied to one input terminal of the variable resistor 15. This curve 31 gives a second reference voltage corresponding to the optimum objective lens current which does not result in defocus at an accelerating voltage determined by a given second working distance shorter than the working distance for the curve 30 (e.g., the shortest working distance of this SEM). This curve 31 can be obtained in the same way as the curve 30. That is, the curve 31 is prepared by previously setting the working distance WD of this SEM to this second working distance, finding the objective lens current that produces no defocus irrespective of changes in the accelerating voltage, and making a desired voltage correspond to this objective lens current. Furthermore, the data to be written to the ROM 21 can be derived by finding the difference between the first and second reference voltages at the same accelerating voltage.

It is assumed that the accelerating voltage-setting portion 12 sets the accelerating voltage to $V_{H1}$ shown in FIG. 2 at a certain value of the working distance WD. The control unit 10 produces the digital value of the accelerating voltage $V_{H1}$ to the first and second reference voltage sources, 13 and 14, respectively. The ROM 19 of the first reference voltage source 13 produces $V_{refl}(V_{H1})$ as the first reference voltage. The ROM 21 of the second reference voltage source 14 produces $\Delta V(V_{H1})$. The output signals from these ROMs are converted into analog form by the D/A converters 20 and 22, respectively.

In FIG. 2, dotted line 32 indicates the boundary between the region in which the effect of the magnetic saturation of the magnetic pole pieces of the objective lens is negligible and the region in which the effect cannot be neglected. On the right side of the dotted line 32, the effect of the magnetic saturation of the magnetic pole pieces of the objective lens appears, while on the left side, the effect is negligible.

The output voltage from the second reference voltage source 14 is applied to one end of the variable resistor 15 which acts as a focus-adjusting means. The other end of the resistor 15 is grounded. The output voltage from the variable resistor 15 is applied to the other input terminal of the adder circuit 16, where it is added to the first reference voltage. If the accelerating voltage is set to $V_{H1}$ by the accelerating voltage-setting portion 12, the output voltage from the adder circuit 16 can be varied within the range from $V_{refl}(V_{H1})$ to $V_{refl}(V_{H1}) + \Delta V(V_{H1})$ by adjusting the variable resistor 15. In this way, the focus can be adjusted.

The output voltage from the adder circuit 16 is applied to the objective lens current source 17, which produces an exciting current corresponding to the output voltage from the adder circuit 16. The exciting current is supplied to the objective lens coil 18.

Accordingly, the objective lens can be easily focused simply by adjusting the variable resistor 15 if the accelerating voltage is varied at any value of the working distance. For example, the curve 30 corresponds to an objective lens current optimal for the longest working distance of the SEM. The curve 31 corresponds to an objective lens current optimal for the shortest working distance. Defocus takes place neither at the longest distance nor at the shortest working distance if the accelerating voltage is varied. At the value of the working distance which needs an objective lens current midway between those two current values, a curve 37 that is midway between the curves 30 and 31 is created by setting the variable resistor 15 to its central position. It is not assured that this curve 37 always agrees with the actual optimum objective lens current indicated by the solid line 33. However, the deviation of the curve 33 from the curve 37 is small, because the deviation of the curve 33 from the dotted line 36 is approximately midway between the deviation of the curve 30 from the dotted line 34 and the deviation of the curve 31 from the dotted line 35. Consequently, the degree of the defocus is small. The objective lens can be easily focused by adjusting the variable resistor 15 only slightly. This principle similarly applies to other values of the working distance.

Figure 3:
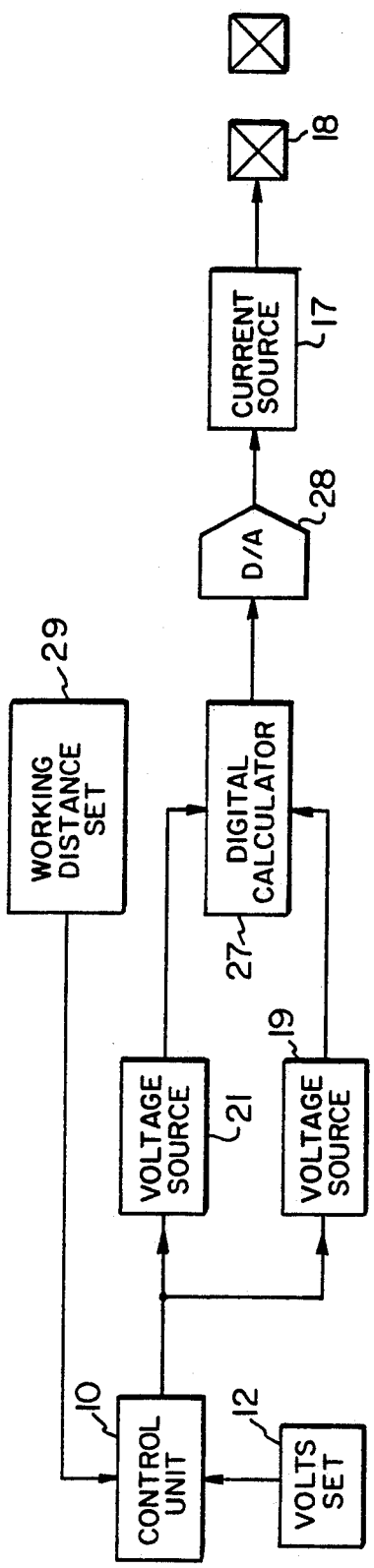
FIG. 3 is a block diagram of another electron beam instrument according to the invention.

Referring next to FIG. 3, there is shown another electron beam instrument according to the invention. It is to be noted that like components are indicated by like reference numerals in various figures. This instrument has a digital calculator 27, a D/A converter 28 connected with the output of the calculator 27, and a working distance-setting means 29 setting the working distance of the objective lens. The setting means 29 is connected with the control unit 10. It is assumed that the accelerating voltage is set to $V_{H1}$ shown in FIG. 2 by the accelerating voltage-setting portion 12 when the working distance WD is $w_0$. The control unit 10 reads data from those memory locations of the ROMs 19 and 21 which are addressed by the accelerating voltage $V_{H1}$. As a result, the ROM 19 produces $V_{refl}(V_{H1})$ as the first reference voltage to the calculator 27. The ROM 21 of the second reference voltage source 14 produces $\Delta V(V_{H1})$ to the calculator 27. Since the working distance-setting means 29 supplies a signal indicating the working distance $w_0$ to the digital calculator 27, this calculator finds the voltage $V(V_{H1})$ by performing the calculation $$V(V_{H1}) = V_{refl}(V_{H1}) + \frac{W_1 - W_0}{W_1 - W_2} \cdot V(V_{H1})$$

where $w_1$ is the longest working distance of the SEM, and $w_2$ is the shortest working distance. The output voltage V from the digital calculator 27 is converted into digital form by the D/A converter 28 and applied to the objective lens current source 17. Thus, the current source 17 produces an exciting current to the objective lens coil 18 according to the output voltage from the digital calculator 27.

Figure 4:
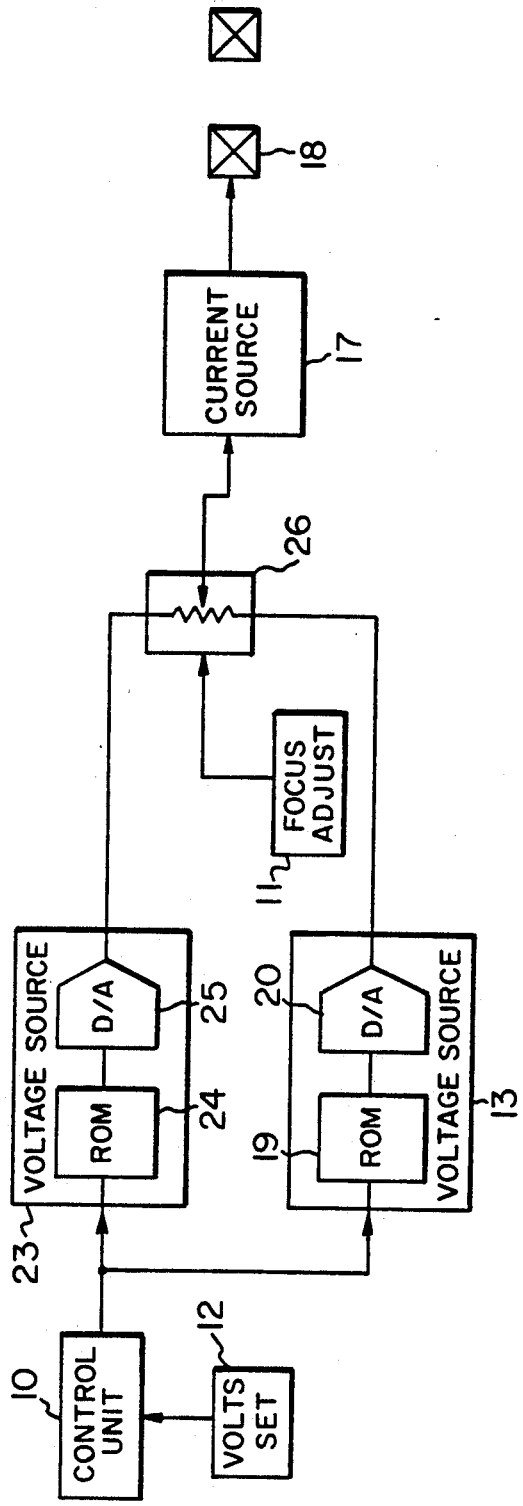
FIG. 4 is a block diagram of a further electron beam instrument according to the invention.

Referring next to FIG. 4, there is shown a further electron beam instrument according to the invention. This instrument is similar to the instrument previously described in conjunction with FIG. 1 except for the following points. A second reference voltage source 23 consists of a ROM 24 and a D/A converter 25. Data about the curve 31 shown in FIG. 2 is stored in the ROM 24. A second reference voltage is read from those memory locations of the ROM 24 which are addressed by the digital value of the accelerating voltage from the control unit 10. This second reference voltage is converted into analog form by the D/A converter 25 and applied to one input terminal of a variable resistor 26. A first reference voltage is applied from the first reference voltage source 13 to the other input terminal of the variable resistor 26 having a movable contact whose position is adjusted by the focus-adjusting mechanism 11. The variable resistor 26 divides the first and second reference voltages according to the position of its movable contact. More specifically, it is assumed that when the movable contact is in the lowest position, the resistance of the resistor 26 is 0 and that when the movable contact is in the uppermost position, the resistor 26 assumes its greatest value. This greatest value is given by 1. It is also assumed that when the movable contact is in an arbitrary position between these two extreme positions, the resistance is x. The output voltage from the variable resistor 26 is $(1-x)V_{ref1}+x \cdot V_{ref2}$. The output voltage from the variable resistor 15 shown in FIG. 1 is $x\Delta V_1 (\Delta V_1 = V_{ref2} - V_{ref1})$. The output from the adder circuit 16 is $V_{ref1} + x\Delta V_1$. Therefore, the output signal supplied to the objective lens current source 17 is the same as the signal supplied in the embodiments described above.

Figure 5:
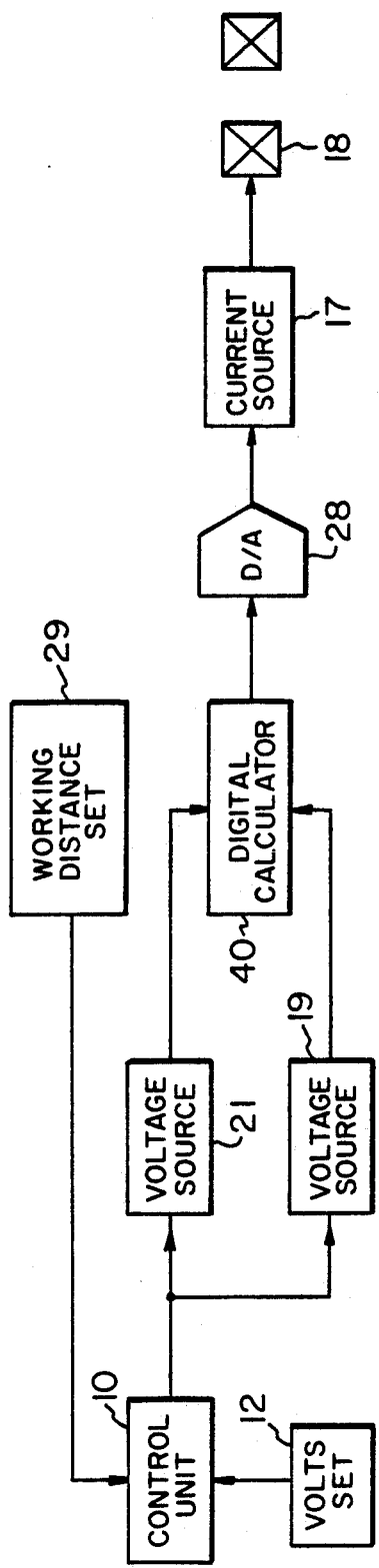
FIG. 5 is a block diagram of still another electron beam instrument according to the invention.

Referring next to FIG. 5, there is shown yet another electron beam instrument according to the invention. This instrument is similar to the instrument already described in connection with FIG. 3 except that the digital calculator 27 is replaced by a digital calculator 40. When the accelerating voltage is set to $V_{H1}$ shown in FIG. 2 by the accelerating voltage-setting portion 12 at a working distance of $w_0$, the control unit 10 supplies the digital value of the accelerating voltage $V_{H1}$ to the ROMS 19 and 21. The ROM 19 produces $V_{ref1}(V_{H1})$ as the first reference voltage to the digital calculator 40. The ROM 21 produces $V_{ref2}(V_{H2})$ as the second reference voltage to the digital calculator 40. To find the voltage V, the calculator 40 which is informed of the working distance $w_0$ from the working distance-setting means 29 performs the calculation $$V(V_{H1}) = V_{ref1}(V_{H1}) + \frac{w_1 - w_0}{w_1 - w_2} \cdot (V_{ref2}(V_{H1}) - V_{ref1}(V_{H1}))$$

where $w_1$ is the longest working distance of the SEM and $w_2$ is the shortest working distance. The output voltage V from the digital calculator 40 is converted into digital form by the D/A converter 28 and applied to the objective lens current source 17. This current source 17 produces an exciting current according to the output voltage from the calculator 40 to the objective lens coil 18.

It is to be noted that the first and second reference voltages are not always required to correspond to the objective lens currents optimum for the longest and shortest working distances, respectively, of this SEM. The reference voltages can be determined, taking account of the range of working distance values often used.

In the above embodiments, the first and second reference voltage sources are equipped with their respective ROMs. Alternatively, the control unit has the data shown in FIG. 2 in the form of tables. In this case, the control unit directly produces the first and second reference voltages.

Figure 6:
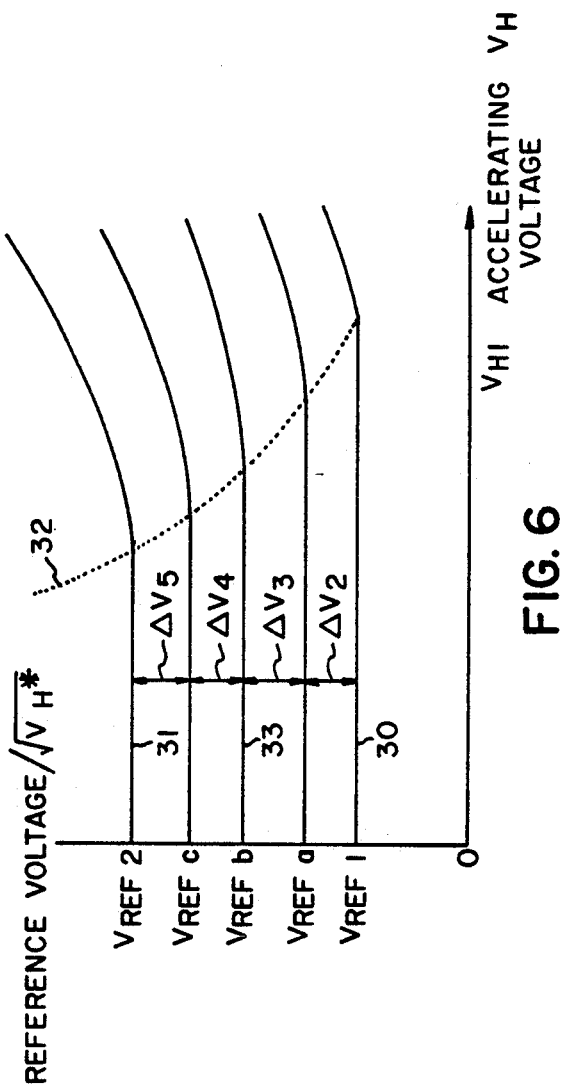
FIG. 6 is a graph illustrating data stored in ROMs incorporated in an electron beam instrument according to the invention.
Figure 7:
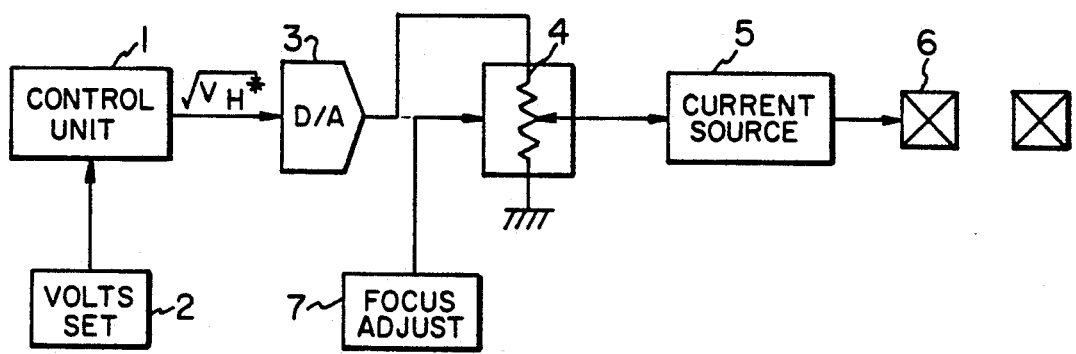
FIG. 7 is a block diagram of a conventional electron beam instrument.
Figure 8:
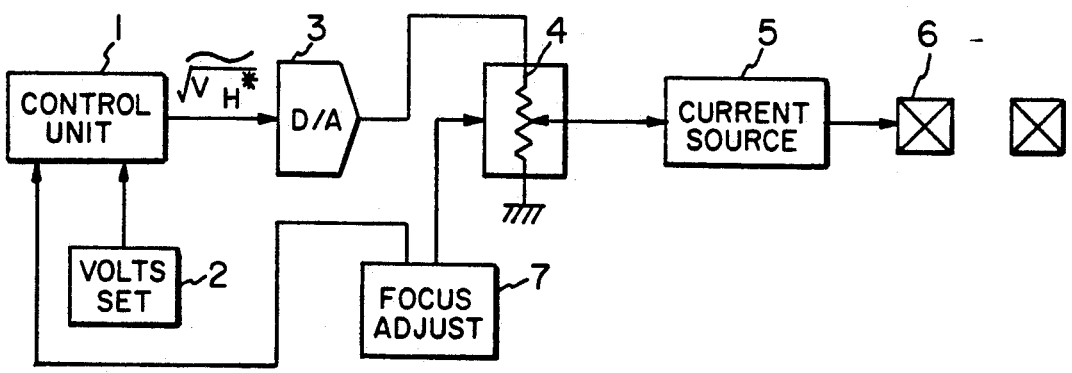
FIG. 8 is a block diagram of another conventional electron beam instrument.

Referring to FIG. 6, a plurality of reference voltages such as $V_{ref1}$, $V_{refa}$, $V_{refb}$, $V_{refc}$, and $V_{ref2}$ may be provided. When the working distance corresponds to a voltage between $V_{ref1}$ and $V_{refa}$, the objective lens current is determined from both $V_{ref1}$ and $\Delta V_2$. When the working distance corresponds to a voltage between $V_{refa}$ and $V_{refb}$, the objective lens current is determined from both $V_{refa}$ and $\Delta V_3$. When the working distance corresponds to a voltage between $V_{refb}$ and $V_{refc}$, the objective lens current is determined from both $V_{refb}$ and $\Delta V_4$. When the working distance corresponds to a voltage between $V_{refc}$ and $V_{ref2}$, the objective lens current is determined from both $V_{refc}$ and $\Delta V_5$. When the working distance corresponds to a voltage between $V_{ref1}$ and $V_{refa}$, the object lens current may be determined, using $V_{ref1}$ and $V_{refa}$ as the reference voltages. When the working distance corresponds to a voltage between $V_{refa}$ and $V_{refb}$, the object lens current may be determined, using $V_{refa}$ and $V_{refb}$ as the reference voltages. When the working distance corresponds to a voltage between $V_{refb}$ and $V_{refc}$, the object lens current may be determined, using $V_{refb}$ and $V_{refc}$ as the reference voltages. When the working distance corresponds to a voltage between $V_{refc}$ and $V_{ref2}$, the object lens current may be determined, using $V_{refc}$ and $V_{ref2}$ as the reference voltages. In this way, the amount of defocus is made infinitesimal.

As can be understood from the description made thus far, focusing can be easily accomplished at every value of the working distance if the accelerating voltage is varied, and if the objective lens current for focusing the objective lens fails to be proportional to the root square of the accelerating voltage due to the magnetic saturation of the objective lens pole pieces.

Having thus described our invention with the detail and particularity required by the Patent Laws, what is claimed to be protected by Letters Patent is set forth in the following claims.

What is claimed is:

1. In an electron beam instrument having an electron gun emitting an electron beam toward a specimen the improvement comprising:

an objective lens;

an accelerating voltage-setting means for setting the accelerating voltage $V_H$ at which the electron beam is accelerated;

a working distance-setting means for setting the working distance of the objective lens;

storage means for storing $V_{ref1}$ and $\Delta V$ as functions of the accelerating voltage $V_H$, where $V_{ref1}$ is a signal indicating the optimum objective lens current at a first working distance $w_1$ and $\Delta V$ is a signal indicating the difference between the optimum objective lens current at a second working distance $w_2$ and the optimum objective lens current at the first working distance;

a reading means for reading the signals $V_{ref1}(V_H)$ and $\Delta V(V_H)$ corresponding to the set accelerating voltage $V_H$ from the storage means according to the output signal from the accelerating voltage-setting means; and an objective lens current-generating means for producing a signal corresponding to a working distance $w_0$ set by the working distance-setting means by interpolation from the signals $V_{ref1}(V_H)$ and $\Delta V(V_H)$ read by the reading means, the objective lens current being set according to the output signal from the objective lens current-generating means.

2. The improvement of claim 1, wherein said objective lens current-generating means comprises D/A converter means for converting the signals $V_{ref1}(V_H)$ and $\Delta V(V_H)$, respectively, into analog form, a resistive element, the potential at one end of the resistive element being set according to the analog output signal $\Delta V(V_H)$ from the D/A converter, the other end being grounded, a terminal in contact with the resistive element for taking out the voltage corresponding to the set working distance $w_0$, and an adder means producing the sum of the output signal from the terminal and the analog output signal $V_{ref1}(V_H)$ from one D/A converter means, and wherein the interpolation is performed in an analog manner.

3. The improvement of claim 1, wherein said objective lens current-generating means comprises: a digital calculation means which digitally performs the interpolation according to the signals $_{ref1}(V_H)$ and $\Delta V(V_H)$ read out and according to the working distance $w_0$ set by the working distance-setting means; and a D/A converter for converting the output signal from the digital calculation means into analog form.

4. In an electron beam instrument having an electron gun emitting an electron beam toward a specimen the improvement comprising:

an objective lens;

an accelerating voltage-setting means for setting the accelerating voltage $V_H$ at which the electron beam is accelerated;

a working distance-setting means for setting the working distance of the objective lens;

storage means for storing $V_{ref1}$ and $V_{ref2}$ as functions of the accelerating voltage, where $V_{ref1}$ and $V_{ref2}$ are signals indicating the optimum objective lens current at a first and a second working distances, respectively;

a reading means for reading the signals $V_{ref1}(V_H)$ and $V_{ref2}(V_H)$ corresponding to the set accelerating voltage from the storage means according to the output signal from the accelerating voltage-setting means; and an objective lens current-generating means for producing a signal corresponding to the working distance $w_0$ set by the working distance-setting means by interpolation from the signals $V_{ref1}(V_H)$ and $V_{ref2}(V_H)$ read by the reading means, the objective lens current being set according to the output signal from the objective lens current-generating means.

5. The improvement of claim 4, wherein said objective lens current-generating means comprises D/A converter means for converting the signals $V_{ref1}(V_H)$ and $V_{ref2}(V_H)$, respectively, into analog form; a resistive element, the potential at one end of the resistive element being set according to the analog output signal $V_{ref1}(V_H)$ from one D/A converter means, the potential at the other end being set according to the analog output signal $V_{ref2}(V_H)$ from the other D/A converter means, and a terminal in contact with the resistive element for taking out the voltage corresponding to the set working distance $w_0$, and wherein the interpolation is performed in an analog manner.

6. The improvement of claim 4, wherein said objective lens current-generating means comprises a digital calculation means which digitally performs the interpolation according to the signals $V_{ref1}(V_H)$ and $V_{ref2}(V_H)$ read out and according to the working distance $w_0$ set by the working distance-setting means, and a D/A converter for converting the output signal from the digital calculation means into analog form.

* * * * *

UNITED STATES PATENT AND TRADEMARK OFFICE
CERTIFICATE OF CORRECTION

PATENT NO. : 5,264,703
DATED : November 23, 1993
INVENTOR(S) : Akira Shibano, Kiyoshi Harasawa It is certified that error appears in the above-indentified patent and that said Letters Patent is hereby corrected as shown below:

Cover page, after [73] Assignee:, "Jeol Ltd." should read --JEOL Ltd.--.

Column 1 Line 5 before "present" insert --The--.

Column 1 Line 38 before "to an" delete "0".

Column 2 Line 13 "Vto" should read --$V_H$ to--.

Claim 3 Line 11 Column 9 "$_{ref1}(V_H)$" should read "$V_{ref1}(V_H)$".

Signed and Sealed this

Seventeenth Day of May, 1994

Attest:

BRUCE LEHMAN

*Attesting Officer*  *Commissioner of Patents and Trademarks*